United States Patent
Luo et al.

(10) Patent No.: US 8,244,961 B2
(45) Date of Patent: Aug. 14, 2012

(54) SSD WITH DISTRIBUTED PROCESSORS

(75) Inventors: Jianjun Luo, Los Gatos, CA (US); ChuanJen Tsu, Saratoga, CA (US)

(73) Assignee: Initio Corporation, San Jose, CA (US)

( * ) Notice: Subject to any disclaimer, the term of this patent is extended or adjusted under 35 U.S.C. 154(b) by 503 days.

(21) Appl. No.: 12/468,748

(22) Filed: May 19, 2009

(65) Prior Publication Data
US 2009/0300274 A1 Dec. 3, 2009

Related U.S. Application Data

(60) Provisional application No. 61/056,308, filed on May 27, 2008.

(51) Int. Cl.
*G06F 12/08* (2006.01)
(52) U.S. Cl. ........................................ 711/103; 711/114
(58) Field of Classification Search .................. 711/103, 711/114
See application file for complete search history.

(56) References Cited

U.S. PATENT DOCUMENTS

| | | | |
|---|---|---|---|
| 2005/0120157 A1 | 6/2005 | Chen et al. | |
| 2005/0160218 A1* | 7/2005 | See et al. | 711/103 |
| 2007/0158808 A1 | 7/2007 | Bruce et al. | |
| 2007/0180328 A1* | 8/2007 | Cornwell et al. | 714/42 |
| 2007/0204128 A1* | 8/2007 | Lee et al. | 711/173 |
| 2008/0013380 A1* | 1/2008 | Cornwell et al. | 365/185.21 |
| 2008/0016269 A1 | 1/2008 | Chow et al. | |
| 2008/0040531 A1 | 2/2008 | Anderson | |
| 2008/0082736 A1 | 4/2008 | Chow et al. | |
| 2008/0114924 A1 | 5/2008 | Frayer et al. | |
| 2009/0083476 A1* | 3/2009 | Pua et al. | 711/103 |
| 2009/0144501 A2* | 6/2009 | Yim et al. | 711/120 |

OTHER PUBLICATIONS

International Search Report and Written Opinion mailed Nov. 5, 2009 in corresponding PCT application No. PCT/US09/45329.
ISR PCT/US09/45326, Jul. 9, 2009.

* cited by examiner

*Primary Examiner* — Michael Tran
(74) *Attorney, Agent, or Firm* — Duane Morris LLP

(57) ABSTRACT

In one embodiment, a system includes a serial data bus, a plurality of processors of a first type, and a processor of a second type. The serial data bus is configured to be coupled to a corresponding serial data bus of a host device. Each of the plurality of processors of the first type is coupled to a respective flash memory device. The processor of the second type is configured to manage the access that the plurality of the processors of the first type have to the serial data bus.

23 Claims, 5 Drawing Sheets

SSD WITH DISTRIBUTED PROCESSORS

CROSS-REFERENCE TO RELATED APPLICATIONS

This application claims priority to U.S. Provisional Patent Application No. 61/056,308, filed on May 27, 2008, which is incorporated by reference herein in its entirety.

FIELD OF DISCLOSURE

The disclosed embodiments relate to storage devices. More specifically, the disclosed embodiments relate to solid-state drives.

BACKGROUND

Solid-state drives (SSD) are a form of data storage that use a solid-state memory to store data. Examples of solid state memory include static random access memory (SRAM), dynamic random access memory (DRAM), and flash memory. Unlike conventional disk drives that include several moving components, an SSD does not have moving parts as data are stored electronically and not on a rotating disk. SSDs experience fewer mechanical failures as they do not include as many moving parts as conventional hard disk drives, which store data on a rotating disk. SSDs typically have faster startup times compared to conventional hard disk drives as SSDs do not require time for a disk to spin up to a particular speed in order for data to be written to, or read from, the disk.

An SSD may include a plurality of NAND flash memory cells or DRAM memory cells. NAND flash memory may be implemented using single-level cells (SLCs) or multi-level cells (MLCs). SLC flash memory stores a single bit of data per cell, and MLC flash memory stores two or more bits of data per cell. Accordingly, MLC flash has a higher density than that of SLC flash and is more commonly used in an SSD than SLC flash due to its lower price and higher capacity. However, SLC flash typically has a lower bit error rate (BER) making it more reliable than its more complex MLC counterpart.

One drawback of flash memory is that it has a finite number of erase-write cycles regardless of whether it is implemented as SLC or MLC. Wear-leveling operations are typically implemented to prolong the life of the flash memory by spreading out the write operations among the flash units of a flash group so that one flash unit is not constantly being written to and erased. These wear-leveling operations, along with bad block management, error correction, and the coordination of read and write cycles, are typically performed or managed by a single flash controller. However, these conventional flash controllers provide slow read and write times. Accordingly, an improved solid-state flash memory architecture is desirable.

SUMMARY

In some embodiments, a solid state drive includes a serial data bus, one or more flash processor units (FPUs), and a supervisor processing unit. Each of the FPUs is configured to manage at least one respective group of flash units. The supervisor processing units is in data communication with each of the one or more FPUs and is configured to manage data transfer between the host and each of the FPUs.

In some embodiments, an integrated circuit chip includes a serial data bus, a plurality of flash processing units (FPUs), and a supervisor processing unit all disposed on the integrated circuit chip. The serial data bus is configured to be coupled to a corresponding serial data bus of a host device. Each of the plurality of FPUs are in data communication with the serial data bus and are configured to manage data transfer to and from a respective group of flash memory units. The supervisor processing unit is in data communication with the serial data bus and each of the plurality of FPUs. The supervisor processing unit is configured to manage access to the serial data bus by each of the FPUs.

In some embodiments, a system includes a serial data bus, a plurality of processors of a first type, and a processor of a second type. The serial data bus is configured to be coupled to a corresponding serial data bus of a host device. Each of the plurality of processors of the first type is coupled to a respective flash memory device. The processor of the second type is configured to manage the access that the plurality of the processors of the first type have to the serial data bus.

DETAILED DESCRIPTION

Figure 1:
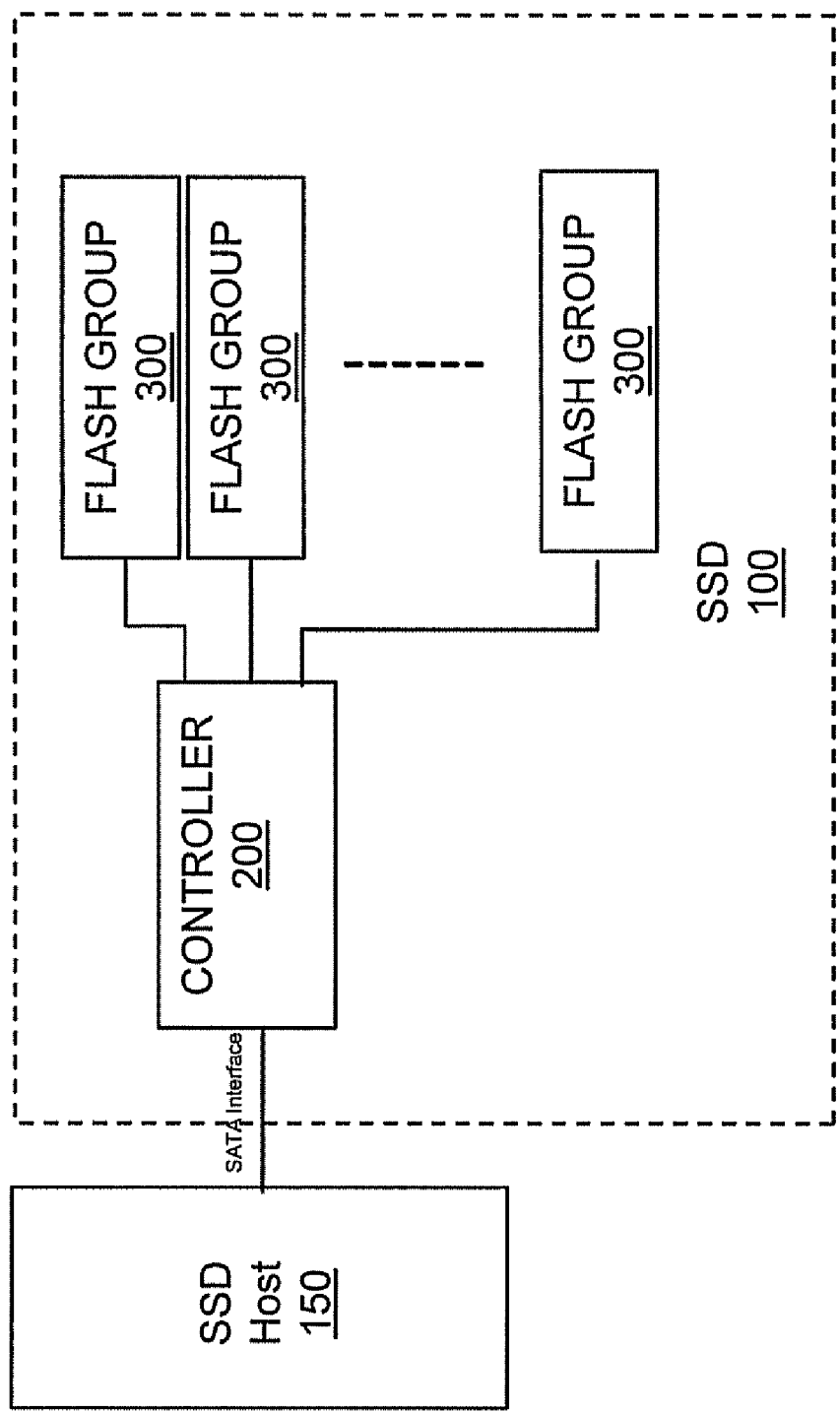
FIG. 1 is a block diagram of one example of a solid-state drive (SSD).

FIG. 1 is a block diagram of one example of an SSD 100 connected to a host 150. Host 150 may be a personal computer such as a laptop or desktop, a workstation, a server, or any device having a central processing unit (CPU). Additionally, host 150 may be configured to run any type of operating system including, but not limited to, Microsoft® Windows, Microsoft® Vista, Linux, UNIX, Mac OS X, FreeBSD®, or the like.

Figure 2:
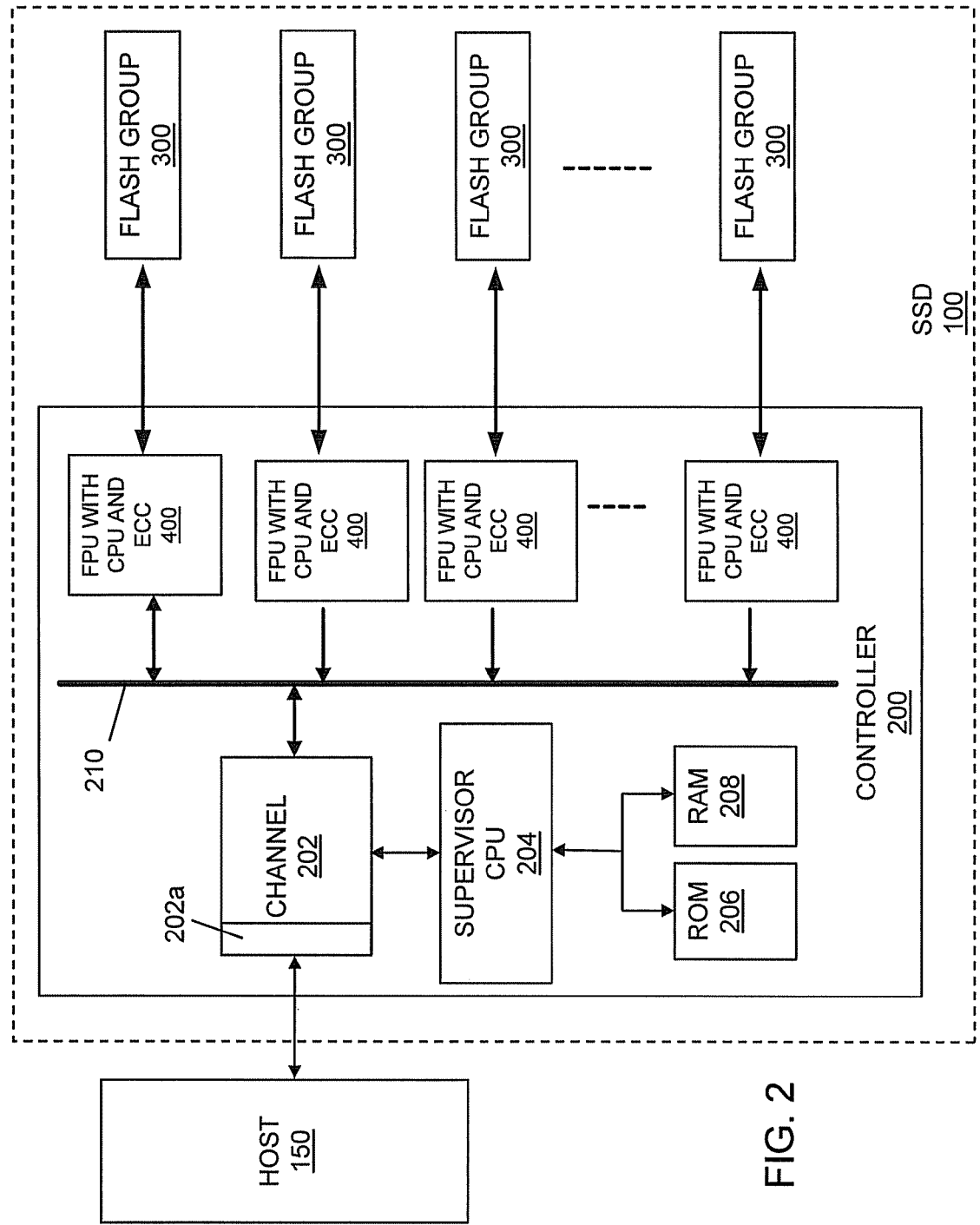
FIG. 2 is a block diagram of the structural and functional components of the controller of the SSD shown in FIG. 1.

As shown in FIG. 1, SSD 100 includes a controller 200 in data communication with a plurality of flash groups 300. In some embodiments, controller 200 may implemented as a single integrated circuit chip. Controller 200 may be configured to perform management operations for the plurality of flash groups 300, which may include single-level cell (SLC) flash, multi-level cell (MLC) flash, or a combination of SLC and MLC. Each flash group 300 may include one or more flash memory units 304. FIG. 2 is a block diagram of the structural and functional components of one example of the controller 200 shown in FIG. 1. As shown in FIG. 2, controller 200 includes a channel 202, a supervisor CPU 204, a read-only memory (ROM) 206, a random-access memory (RAM) 208, and one or more flash processor units (FPU) 400. A bus 210 may connect each of the FPUs 400 to channel 202. Bus 210 may be a USB bus, SATA bus, or a self-defined bus.

Channel 202 may be configured to act as a bridge between host 150 and the FPUs 400 to enable data transfer between the flash groups 300 and host 150. In some embodiments, channel 202 is a serial advanced technology attachment (SATA) channel. However, channel 202 may be another type of serial data bus such as, for example, a universal serial bus (USB) channel. Channel 202 may include an interface 202a such as, for example, a SATA interface, a USB interface, or the like that may be configured to engage a corresponding interface of host 150.

Supervisor CPU 204 may be a processor, microprocessor, microcontroller, or like device configured to manage data transfer between the host 150 and each of the FPUs 400. ROM 206 may be any type of read-only memory including, but not limited to, programmable read-only memory (PROM), erasable programmable read-only memory (EPROM), or electrically erasable programmable read-only memory (EEPROM). RAM 208 may be any type of random-access memory such as, for example, static random-access memory (SRAM), or dynamic random-access memory (DRAM).

Figure 3:
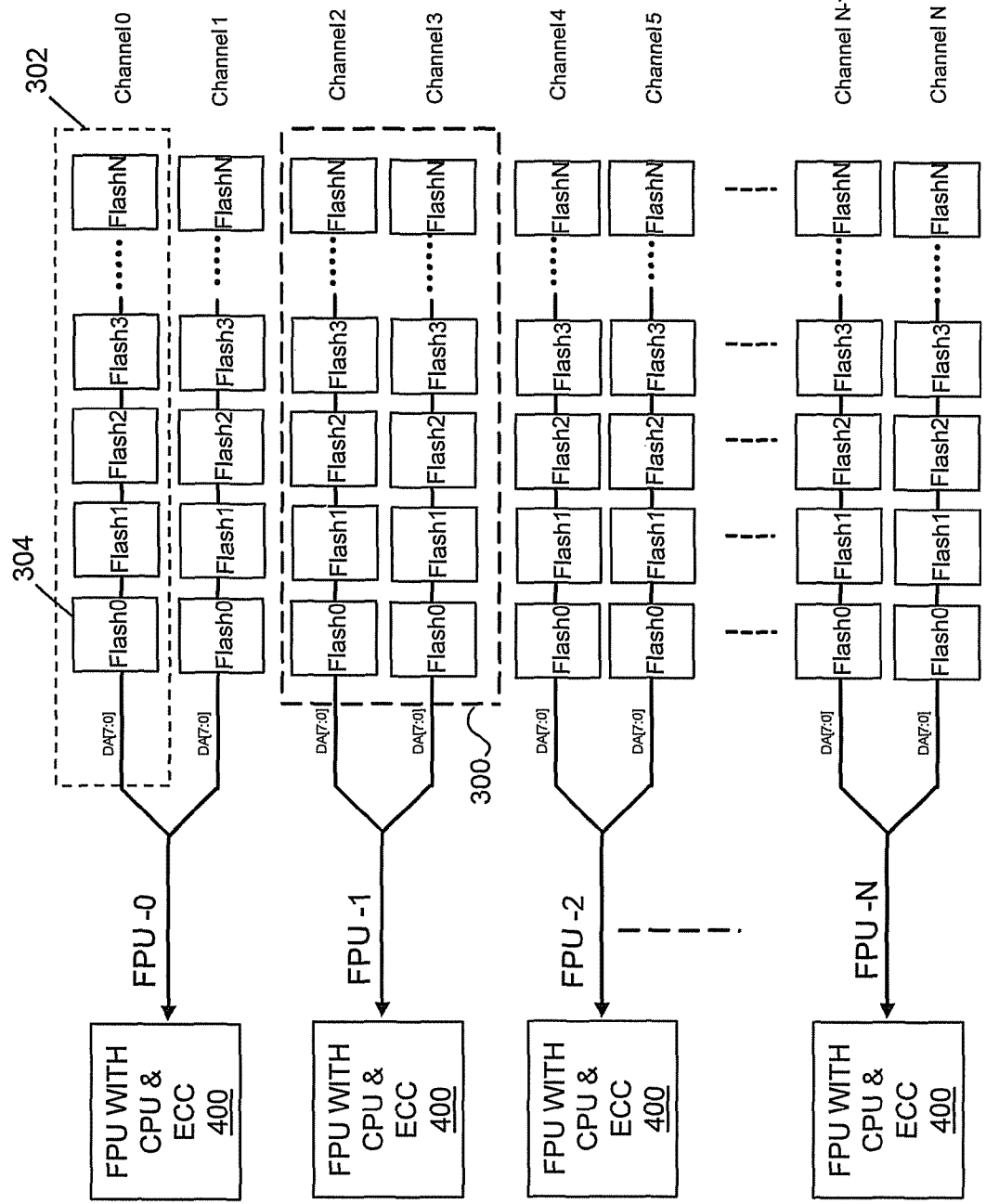
FIG. 3 is a block diagram of one example of the flash units connected to the flash processor units shown in FIG. 2.

FIG. 3 is a block diagram of one example of a connection between a plurality of FPUs 400 and flash groups 300. As shown in FIG. 3, each FPU 400 may be connected to a flash group 300. In some embodiments, each flash group 300 includes two flash channels 302, although fewer or more flash channels 302 may be implemented. Each flash channel 302 may include one or more flash memory units 304 that may be connected to one another in serial, parallel, or in some combination thereof. The number of flash groups 300 connected to the controller 200 may be varied depending on the data storage requirements of a particular system.

Figure 4:
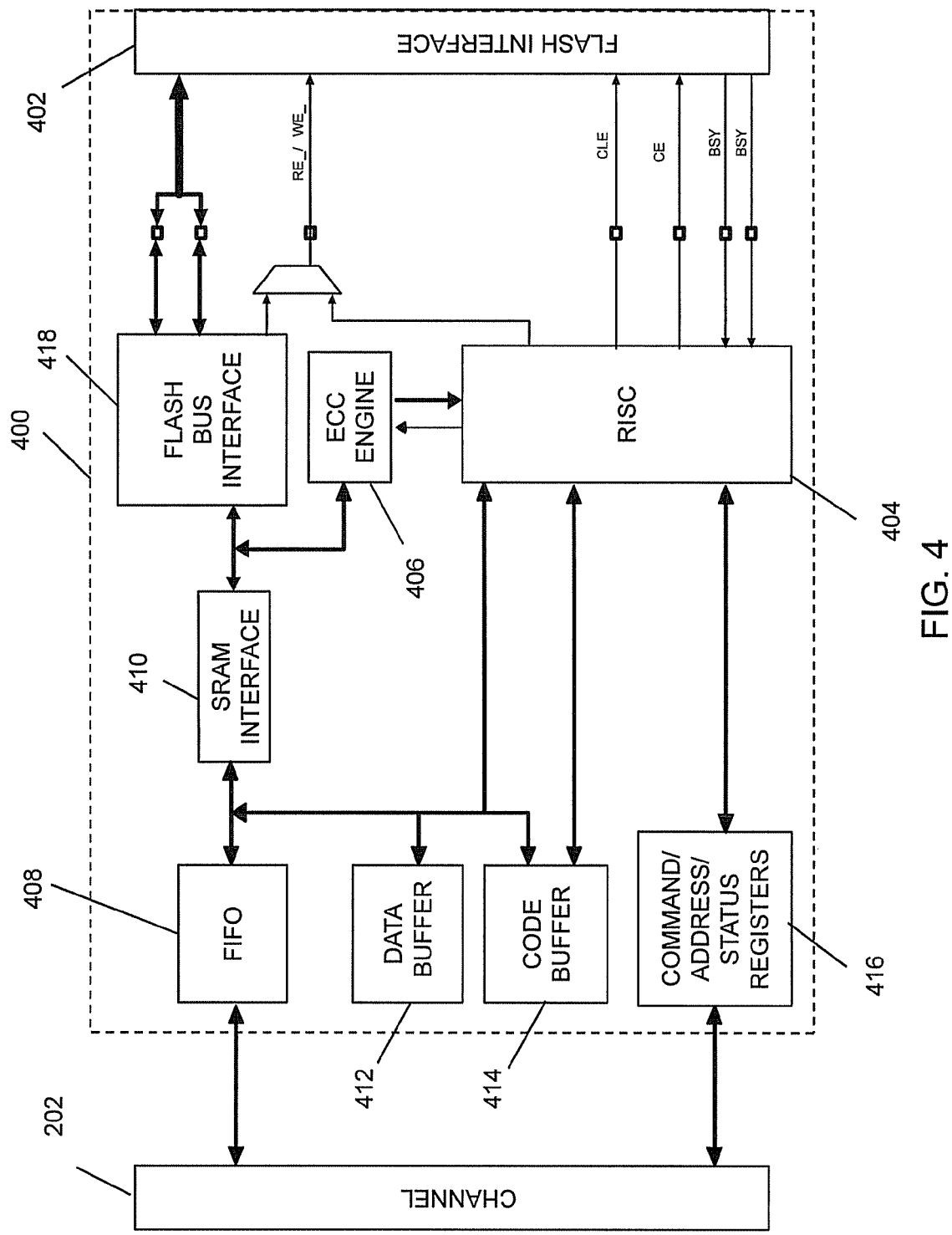
FIG. 4 is a block diagram of the structural and functional components of an FPU as shown in FIG. 2.
Figure 5:
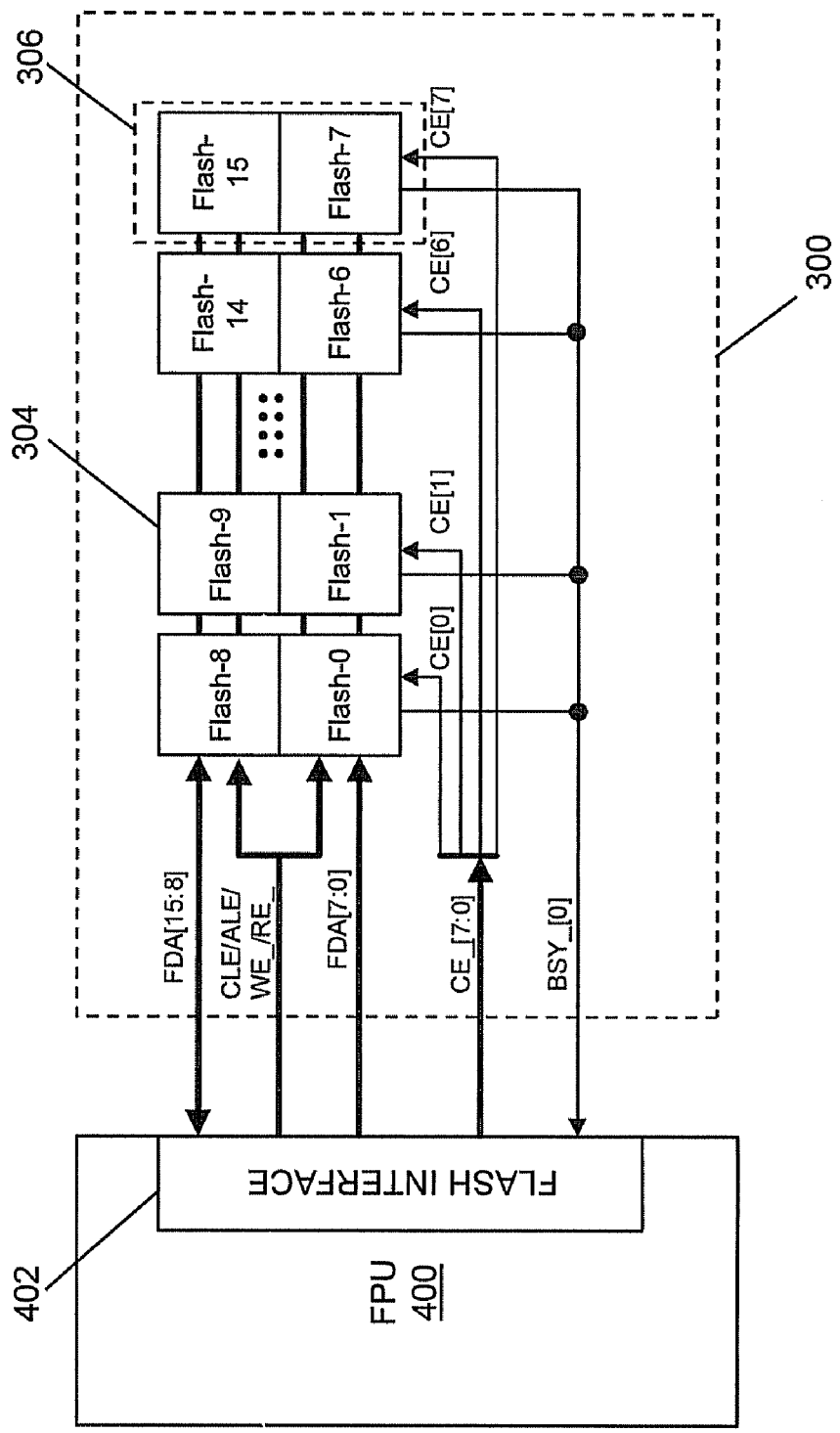
FIG. 5 is a block diagram of one example of a connection between a flash processor unit and a flash group shown in FIG. 3.

FIG. 5 is a block diagram of one example of a connection between an FPU 400 and a flash group 300 as illustrated in FIG. 3. As shown in FIG. 5, each FPU 400 may include a flash interface 402 through which the FPU 400 may be connected to a respective flash group 300. Flash interface 402 may include logic circuitry configured to select and deselect a flash sub-group 306 or a flash memory unit 304. Each FPU 400 may also include a processor such as a reduced instruction set computer (RISC) 404 (see FIG. 4) or other microprocessor units configured to perform one or more operations with respect to the flash group 300 as described below. In some embodiments, each FPU 400 includes an 8-bit RISC, although RISCs having other processing capabilities may be used. Examples of other microprocessors that may be implemented as an FPU include, but are not limited to, PIC16xx/17xx series microcontrollers available from Microchip Technology of Chandler, Ariz., MIPS architecture microprocessors available from MIPS Technologies of Mountain View, Calif., and 8051 microcontrollers. Each flash sub-group 306 may have a respective Chip Enable signal (CE), and all of the flash memory units 304 may be connected to the same flash control signal lines including, but not limited to, Command Latch Enable (CLE), Read (RE), and Write (WE) signal lines.

FIG. 4 is a block diagram illustrating one example of the structural and functional components of an FPU 400. As shown in FIG. 4, an FPU 400 may include a First-In-First-Out (FIFO) register 408 that may be connected to the channel 202, an SRAM interface 410, a data buffer 412, a code buffer 414, and the RISC 404. Command/address/status registers 416 may also be connected to channel 202 and to RISC 404. SRAM interface 410 may be connected to a flash bus interface 418 and an error correction code (ECC) engine 406. ECC engine 406 may be connected to RISC 404. Flash bus interface 418 and RISC 404 may be connected to the flash interface 402.

In some embodiments, FIFO 408 may be 2K by 32-bit data FIFO implemented using SRAM. Data buffer 412 and code buffer 414 may also be implemented using SRAM, although it is understood that FIFO 408, data buffer 412, and code buffer 414 may be implemented using other memory types or registers. FIFO 408, data buffer 412, and code buffer 414 are configured to receive and buffer the data received from, or being transmitted to, channel 202 via SRAM interface 410 and flash bus interface 418.

ECC engine 406 may be configured to execute an error correction coding on data being written to or read from a flash group 300 in conjunction with RISC 404. For example, the ECC may be a Hamming code, a Reed-Solomon code, or like code that may be used to determine and correct data errors. RISC 404 may be configured to perform wear-leveling, bad block management, and other operations conventionally performed by a single flash controller. For example, a table may be stored in the flash groups 300 identifying the location of one or more bad blocks of data. These bad blocks may be the result of over-use and will be skipped when a data read/write is executed.

Each FPU 400 may include its own firmware, which may be different from the firmware of other FPUs 400 advantageously enabling each FPU 400 to perform different operations as well as enabling different types of flash blocks 300 to be connected to controller 200. For example, a first flash group 300 including a plurality of SLC flash memory units 304 may be connected to a first FPU 400, a second flash group 300 including a plurality of MLC flash memory units 304 may be connected to a second FPU 400, and a third flash group including a combination of SLC and MLC flash memory units may be connected to a third FPU 400. The first, second, and third FPUs 400 may each be configured with distinct firmware that enables the first FPU to perform error correction, bad block management, or the like on MLC flash units, the second FPU to perform error correction, bad block management, or the like on the SLC flash units, and the third FPU to perform error correction, bad block management, or the like on the combination of SLC and MLC flash units while each of the first, second, and third FPUs being managed by the same controller 200. In some embodiments, Accordingly, the distributed architecture of controller 200 advantageously enables an SSD to be implemented having a blend of reliability and performance while at the same time reducing the amount of processing performed by the supervisor CPU 204. Additionally, the distributed architecture reduces the amount of processing performed by each processor increasing the performance of the SSD.

With reference to FIGS. 1-4, the operation of SSD 100 is now described. When host 150 is powered on, ROM 206 may load firmware into RAM 208 for execution by supervisor CPU 204. The firmware loaded from ROM 206 may be specific to the operations that the supervisor CPU 204 will perform. For example, the firmware may instruct the supervisor CPU 204 to manage data transfer between the host 150 and each of the FPUs 400. Put another way, the supervisor CPU 204 may receive a data read or write request from host 150, which supervisor CPU 204 may then route to the appropriate FPU 400. Additionally, bus 210 may be configured to transmit busy and/or interrupt signals to and from supervisor CPU 204 and FPUs 400. For example, the supervisor CPU 204 may check the status of each of the FPUs 400 by checking the busy signal of each FPU 400. If the busy signal is low, for example, then the FPU 400 may be performing a read or write operation. If the busy signal is high, for example, then an FPU 400 may be available to perform a read or write operation, and the supervisor CPU 204 may send an interrupt signal to the FPU 400 to begin a flow of data between host 150 and an FPU 400. In this manner, the supervisor CPU 204 may act as a bus arbiter by coordinating the read and write requests from host 150 by issuing interrupt signals to the FPUs 400 and checking the busy signals of the FPUs 400 to coordinate the transfer of data between the host 150 and the FPUs 400.

FPUs 400, each having their own firmware, may receive a data read or a data write request from supervisor CPU 204 and, in response, access the appropriate one or more flash memory units 304 of a flash group 300. FPUs 400 may perform error correction on the data being retrieved from flash groups 300. Additionally, FPUs 400 may perform wear-leveling and bad block management operations that are conventionally performed by a single flash controller. FPUs 400 may also be configured to support interleaving operations to support the connection of one or more channels 302 of flash memory as shown in FIG. 3. With each FPU 400 configured to support interleaving operations and being connected to two flash channels 302, the memory capacity of SSD 100 of host 150 may be increased. The distributed processor architecture of the controller 200 reduces the workload of the supervisor CPU 204 by distributing the work among a plurality of RISC FPUs 400 thereby reducing latency times and enabling higher data transfer rates than may be achieved by conventional architectures. Additionally, the distributed architecture enables a single controller 200 to support various flash types, e.g., SLC, MLC, or a combination thereof, providing the flexibility to manufacture an SSD with an improved blend of reliability and performance.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A solid state drive, comprising:
    a controller formed on a single integrated circuit chip, the controller including
        a first serial data bus configured to be coupled to a corresponding serial data bus of a host device;
        at least two flash processor units (FPUs) coupled to the first serial data bus, each of the at least two FPUs configured to manage at least one respective group of flash memory units that is coupled to the controller though a flash interface of the FTU, one of the flash memory units comprising a group of single-level cell (SLC) flash units; and
        a supervisor processing unit in data communication with each of the one or more FPUs, the supervisor processing unit configured to manage data transfer between the host and each of the FPUs.

2. The solid state drive of claim 1, wherein each of the FPUs is configured to perform an error correction coding on data received from the at least one respective group of flash memory units.

3. The solid state drive of claim 1, wherein each of the FPUs is configured to perform wear-leveling for the at least one respective group of flash memory units.

4. The solid state drive of claim 1, wherein each of the FPUs is configured to perform bad block management for the at least one respective group of flash memory units.

5. The solid state drive of claim 1, wherein at least one of the at least two flash processor units is coupled to a group of single-level cell (SLC) flash units and to a group of multi-level cell (MLC) flash units.

6. The solid state drive of claim 1, wherein one of the at least two FPUs is coupled to a group of multi-level cell (MLC) flash units.

7. The solid state drive of claim 1, wherein the flash group includes a combination of single-level cell (SLC) flash units and multi-level cell (MLC) flash units.

8. An integrated circuit chip, comprising:
    a first serial data bus disposed on the integrated circuit chip and configured to be coupled to a corresponding serial data bus of a host device;
    a plurality of flash processing units (FPUs) disposed on the integrated circuit chip in data communication with the first serial data bus, each of the FPUs configured to manage data transfer to and from a respective group of flash memory units through respective flash interfaces formed on the integrated circuit chip; and
    a supervisor processing unit disposed on the integrated circuit chip and in data communication with the first serial data bus and each of the plurality of FPUs, the supervisor processing unit configured to manage access to the first serial data bus by each of the FPUs,
    wherein each of the plurality of FPUs include:
        a microprocessing unit having a processing capability that is less than a processing capability of the supervisor processing unit; and
        an error correction code (ECC) engine connected to the microprocessing unit for performing error correction.

9. The integrated circuit of claim 8, wherein the first serial data bus is a serial advanced technology attachment (SATA) channel.

10. The integrated circuit of claim 8, wherein the first serial data bus is a universal serial bus (USB) channel.

11. The integrated circuit of claim 8, wherein each of the FPUs includes a flash interface having logic configured to select and deselect a flash memory unit of the respective group of flash memory units.

12. The integrated circuit of claim 8, wherein each of the plurality of FPUs is configured to perform an error correction coding for the respective groups of flash memory units.

13. The integrated circuit of claim 8, wherein each of the plurality of FPUs is configured to perform wear-leveling for the respective group of flash memory units.

14. The integrated circuit of claim 8, wherein each of the plurality of FPUs is configured to perform bad block management for the respective group of flash memory units.

15. A system, comprising:
    a memory controller disposed on a single integrated circuit chip, the memory controller including
        a first serial data bus configured to be coupled to a corresponding serial data bus of a host device;
        a plurality of processors of a first type, each of the plurality of processors of the first type coupled to the first serial bus and to a respective flash memory device through a respective flash interface that is formed on the integrated circuit chip, and
        a processor of a second type configured to manage access by the plurality of processors of the first type to the first serial data bus,
    wherein each of the plurality of processors of the first type are configured to perform wear-leveling and to execute an error correction code for the respective flash memory device to which it is coupled, and
    wherein at least one of the flash memory devices includes multi-level cell flash and at least one of the flash memory devices includes single-level cell flash.

16. The system of claim 15, wherein the first serial data bus is a serial advanced technology attachment (SATA) channel.

17. The system of claim 15, wherein the first serial data bus is a universal serial bus (USB) channel.

18. A memory system, comprising:
    a plurality of flash groups including a combination of single-level cell (SLC) flash units and multi-level cell (MLC) flash units; and a controller coupled to the plurality of flash groups, the controller formed on an integrated circuit chip and including:
　at least two flash processor units (FPUs), each of the at least two FPUs coupled to a respective flash group through respective flash interface of the FPU, and
　a supervisor processing unit in data communication with each of the at least two FPUs and to a serial data bus, the supervisor processing unit configured to manage data transfer between a host and each of the at least two FPUs by way of the serial data bus.

19. The memory system of claim 18, wherein each of the FPUs includes a flash interface having logic configured to select and deselect a flash memory unit of the respective group of flash memory units.

20. The memory system of claim 18, wherein each of the FPUs is configured to perform an error correction coding for the plurality of flash groups.

21. The memory system of claim 18, wherein each of the FPUs is configured to perform wear-leveling for the plurality of flash groups.

22. The memory system of claim 18, wherein the serial data bus is a serial advanced technology attachment (SATA) channel.

23. The memory system of claim 18, wherein the serial data bus is a universal serial bus (USB) channel.

* * * * *

UNITED STATES PATENT AND TRADEMARK OFFICE
CERTIFICATE OF CORRECTION

| | | |
|---|---|---|
| PATENT NO. | : 8,244,961 B2 | Page 1 of 1 |
| APPLICATION NO. | : 12/468748 | |
| DATED | : August 14, 2012 | |
| INVENTOR(S) | : Jianjun Luo et al. | |

It is certified that error appears in the above-identified patent and that said Letters Patent is hereby corrected as shown below:

Column 5, Line 41, delete "FTU" and insert -- FPU -- therefor.

Signed and Sealed this
Sixteenth Day of October, 2012

David J. Kappos
*Director of the United States Patent and Trademark Office*